United States Patent
Aoki et al.

(10) Patent No.: US 6,363,976 B1
(45) Date of Patent: Apr. 2, 2002

(54) SEMICONDUCTOR MANUFACTURING APPARATUS AND METHOD OF MANUFACTURING SEMICONDUCTOR DEVICE

(75) Inventors: Hideji Aoki; Hidekazu Manabe; Katsuhito Kamachi, all of Tokyo (JP)

(73) Assignee: Mitsubishi Electric Engineering Co., Ltd. (JP)

( * ) Notice: Subject to any disclaimer, the term of this patent is extended or adjusted under 35 U.S.C. 154(b) by 0 days.

(21) Appl. No.: 09/496,412

(22) Filed: Feb. 2, 2000

(30) Foreign Application Priority Data

Sep. 8, 1999 (JP) .......................................... 11-254123

(51) Int. Cl.$^7$ ................................................. B21F 1/00
(52) U.S. Cl. ......................................... 140/105; 72/21.4
(58) Field of Search ............................. 140/105; 72/21.4

(56) References Cited

U.S. PATENT DOCUMENTS

| 5,027,866 A | * | 7/1991 | Matsumoto | 140/105 |
| 5,222,528 A | * | 6/1993 | Downing | 140/105 |
| 5,283,946 A | * | 2/1994 | Simmons et al. | 140/105 |

FOREIGN PATENT DOCUMENTS

| JP | 4-196257 | 7/1992 |
| JP | 5-275589 | 10/1993 |

* cited by examiner

Primary Examiner—Lowell A. Larson

(57) ABSTRACT

A semiconductor manufacturing apparatus and a method of manufacturing a semiconductor device are provided. A horizontal driver (111) and a vertical driver (112) are controlled to move a punch holder (110), or an end portion (101T1) of a punch (101), within a plane defined by first and second directions (D1, D2). A tip (101A) of the punch (101) is brought into contact with leads (11), with a punch-side forming surface (101S) and a die-side forming surface (151S) maintained in parallel relationship. A pressurizer (131) is controlled to move the end portion (101T1) in a fourth direction (D4) toward the die-side forming surface (151S), and the punch-side forming surface (101S) and the die-side forming surface (151S) hold the leads (11) therebetween. A pressure detector (121) detects a load placed upon the punch (101). A controller (190) receives a detection signal (S121) from the pressure detector (121) and controls the pressurizer (131) to place a predetermined load upon the lead (11) held between the punch-side forming surface (101S) and the die-side forming surface (151S). The semiconductor manufacturing apparatus is capable of accurately forming the leads of the semiconductor device without damages to the leads.

12 Claims, 11 Drawing Sheets

SEMICONDUCTOR MANUFACTURING APPARATUS AND METHOD OF MANUFACTURING SEMICONDUCTOR DEVICE

BACKGROUND OF THE INVENTION

1. Field of the Invention

The present invention relates to a semiconductor manufacturing apparatus and a method of manufacturing a semiconductor device and, more particularly, to a technique for forming a lead of a semiconductor device.

2. Description of the Background Art

Background art first and second lead forming apparatuses 100P and 200P will be described hereinafter with reference to FIGS. 13 through 17.

First, a semiconductor device 10P is prepared which has leads 11P projecting from a package 12P in first and third directions D1 and D3 (both horizontal) perpendicular to each other. Only leads 11P projecting in the first direction D1 are shown in FIGS. 13 through 16, and the forming of these leads 11P will be mainly described. The semiconductor device 10P is placed on a die 151P fixed to a lower body of a press (not shown) of the first lead forming apparatus 100P.

An upper body of the press including a punch holder 110P, an openable block 120P, a stripper 181P and the like moves downwardly in a second direction D2 (vertical). At the start of the downward movement, the stripper 181P and the die 151P together hold therebetween part of the lead 11P which is near the package 12P. As the upper body continues moving downwardly, an end portion 101T1P of a punch 101P comes into contact with the lead 11P.

A structure of the upper body will be described below. The punch 101P is mounted on the punch holder 110P for pivotal movement about a shaft 105P both in a direction indicated by the arrow A11P (also referred to hereinafter as an "opening direction A11P") and in a direction indicated by the arrow A12P (also referred to hereinafter as a "closing direction A12P"). An end portion 101T2P of the punch 101P opposite from the end portion 101T1P with respect to the shaft 105P and the punch holder 110P are coupled to each other by a spring 106P. The spring 106P urges, or exerts a pivoting force on, the end portion 101T2P in the opening direction A11P. A roller 101RP is mounted on the end portion 101T2P and is in contact with a vertical surface 120S1P or an inclined surface 120S2P of the openable block 120P. The openable block 120P and the punch holder 110P are movable in the second direction D2 independently of each other. At the start of the downward movement of the upper body, the roller 101RP is in contact with the vertical surface 120S1P, and the end portion 101T1P is at the limit of the pivotal movement of the punch 101P in the opening direction A11P. Although only the single punch 101P and the components associated with the operation thereof are shown in FIGS. 13 through 16 for purposes of illustration, the background art lead forming apparatus 100P comprises a plurality of such structures. For example, for the package 12P (known as a QFP (Quad Flat Package)) of a quadrilateral configuration as viewed in the second direction D2 with the leads 11P projecting from the four end surfaces 12SP (as shown in FIG. 17) of the package 12P which correspond, respectively, to the four sides of the quadrilateral configuration, the punch 101P and its associated components are provided for each of the end surfaces 12SP. This holds true for the second lead forming apparatus 200P to be described later.

The upper body stops moving downwardly when the end portion 101T1P comes into contact with the lead 11P. Thereafter, the openable block 120P moves upwardly. As the openable block 120P moves upwardly, the roller 101RP moves along the inclined surface 120S2P, and the end portion 101T1P accordingly pivots about the shaft 105P in the closing direction A12P. Such a pivotal movement causes the lead 11P to be bent in a direction indicated by the arrow A1P of FIG. 13. Specifically, the pivotal movement of the end portion 101T1P in contact with the lead 11P in the closing direction A12P forces a punch-side forming surface 101SP (shown in FIG. 14) to bend the lead 11P toward a die-side forming surface 151SP (shown in FIG. 14).

When the lead 11P is bent into a predetermined configuration, the openable block 120P stops and then starts moving downwardly. This causes the end portion 101T1P to pivot in the opening direction A11P to bring the punch 101P out of contact with the lead 11P. Thereafter, the upper body and the stripper 181P move upwardly, and the upper body returns to its original position. This completes a series of operations.

After the first lead forming apparatus 100P forms a shoulder of the lead 11P, the second lead forming apparatus 200P forms a distal portion of the lead 11P. This forms the lead 11P into a final configuration.

As illustrated in FIGS. 15 and 16, the second lead forming apparatus 200P is similar in construction to the first lead forming apparatus 100P except that a die-side forming surface 252SP of a die 252P and a punch-side forming surface 201SP of a punch 201P differ in configuration from the above described forming surfaces 151SP and 101SP (shown in FIG. 14). The forming surfaces 252SP and 201SP of the second lead forming apparatus 200P are configured and sized to conform to the final configuration of the lead.

The second lead forming apparatus 200P performs an operation similar to that of the first lead forming apparatus 100P described above to finish the semiconductor device 10P having the leads 11P shown in FIG. 17.

The background art lead forming apparatuses 100P and 200P present problems to be described below. Although the problems with the first lead forming apparatus 100P are described below, the description applies equally to the second lead forming apparatus 200P.

<Problem (1): Scratch on Lead Being Formed>

As above described, the background art lead forming apparatus 100P bends the lead 11P by pivoting the end portion 101T1P in contact with the lead 11P in the closing direction A12P. Since the end portion 101T1P moves or lowers in the second direction D2 while being pivoted during the bending, i.e., slides on the lead 11P, the lead 11P is scratched or a metal plating is removed from the lead 11P. It is contemplated that the background art lead forming apparatus 100P can alleviate the sliding movement to some extent by rendering the punch 101P pivotable about the shaft 105P. In the lead forming apparatus 100P, however, the center of curvature of the lead 11P being bent does not always coincide with the center (of curvature) of a path of movement of the end portion 101T1P. In other words, the shape of the lead 11P being bent is not taken into consideration to pivot the end portion 101T1P. This might cause an intensive pressure to be applied between the end portion 101T1P and the lead 11P. It is therefore difficult to completely prevent the above described scratches and the like.

Additionally, the lead 11P held between the stripper 181P and the die 151P might be dented. When a force that lifts the semiconductor device 10P is developed by the above described sliding movement and exerted upon the lead 11P, such a dent is significantly great.

The scratches and the like on the lead 11P give rise to the oxidation or corrosion of the lead 11P to result in the increase in resistance of the lead 11P or a break in the lead 11P, causing the semiconductor device 10P to be incapable of performing a predetermined operation.

<Problem (2): Nonuniform Lead Configurations>

As above described, the background art lead forming apparatus 100P comprises the punch 101P and its associated components which are provided for each end surface 12SP of the package 12P. Thus, variations in size of the punch 101P and the die 151P occur due to, for example, manufacturing accuracy and wear with time to cause differences in clearance between the punch 101P and the die 151P. In view of the fact that the punches 101P are similarly disposed in a predetermined position of the upper body, the bending of the leads 11P with the differences in clearance maintained gives rise to variations in timing of contact between the punch 101P and the lead 11P. In such a case, it is difficult to impose a uniform forming load on all of the leads 11P. Therefore, variations in configuration of the leads 11P occur throughout the semiconductor device 10P.

Another background art technique is such that a plurality of semiconductor devices 10P are arranged, for example, linearly on the die 151P and the single punch 101P simultaneously bends all of the leads 11P arranged in the direction in which the semiconductor devices 10P are arranged. In this operation, a forming load from the press is imposed simultaneously on the multiplicity of leads 11P. However, uniformly placing the forming load sufficient for the bending upon the leads 11P is difficult because of the very large number of leads 11P. Thus, application of such a forming technique also presents the problem of variations in lead configuration.

Further, the stripper 181P and the die 151P hold the plurality of leads 11P therebetween. When, for example, warpage or disorder exists in the array of leads 11P (at their proximal ends) projecting from the same end surface 12SP, the leads 11P are held with the warpage or disorder corrected. After the leads 11P are formed under such a situation, the warpage or disorder is restored by the release of the corrective force. As a result, the array or arrangement of distal portions of the formed leads 11P reflects the warpage or disorder.

The semiconductor device 10P thus manufactured comprises the leads 11P having the respective distal portions which do not lie in the same plane because of the nonuniformity of the leads 11P. Hence, the semiconductor devices 10P manufactured by the background art lead forming apparatus 100P do not provide a sufficient bonding strength when mounted and soldered onto a circuit board.

SUMMARY OF THE INVENTION

According to a first aspect of the present invention, a semiconductor manufacturing apparatus comprises: a die having a die-side forming surface of a predetermined configuration and capable of receiving a semiconductor device including a package and a lead projecting from the package, with the lead in face-to-face relationship with the die-side forming surface; a punch having an end portion provided with a punch-side forming surface in face-to-face relationship with the die-side forming surface, the end portion performing a predetermined working operation upon the lead; and a driver for moving the end portion of the punch substantially squarely toward the die-side forming surface, with the punch-side forming surface and the die-side forming surface maintained in parallel relationship.

Preferably, according to a second aspect of the present invention, the semiconductor manufacturing apparatus of the first aspect further comprises: a pressure detector for detecting a load placed upon the end portion; and a controller for controlling the driver based on the load detected by the pressure detector.

Preferably, according to a third aspect of the present invention, the semiconductor manufacturing apparatus of the first or second aspect further comprises a resilient element between the end portion and the driver.

Preferably, according to a fourth aspect of the present invention, the semiconductor manufacturing apparatus of any one of the first to third aspects further comprises a rotative driver for rotating at least one of the punch, the die and the semiconductor device about the package, with a positional relationship maintained between the punch, the die and the semiconductor device relative to each other.

Preferably, according to a fifth aspect of the present invention, the semiconductor manufacturing apparatus of any one of the first to fourth aspects further comprises a retainer having a mechanism for adhering to the package under suction, the retainer coming into contact with the package on an opposite side from the die to hold the semiconductor device.

Preferably, according to a sixth aspect of the present invention, the semiconductor manufacturing apparatus of any one of the first to fifth aspects further comprises a contact detector for detecting contact between the end portion and the die-side forming surface, with the lead therebetween.

Preferably, according to a seventh aspect of the present invention, in the semiconductor manufacturing apparatus of any one of the first to sixth aspects, the lead of the semiconductor device includes a plurality of leads; and the punch performs the predetermined working operation simultaneously upon a group of leads projecting substantially in the same direction among the plurality of leads.

Preferably, according to an eighth aspect of the present invention, in the semiconductor manufacturing apparatus of the seventh aspect, the group of leads are divided into at least two blocks; and adjacent ones of the leads included in each of the blocks are connected at their tips to each other.

Preferably, according to a ninth aspect of the present invention, in the semiconductor manufacturing apparatus of any one of the first to eighth aspects, the punch includes a plurality of punches movable independently of each other.

Preferably, according to a tenth aspect of the present invention, in the semiconductor manufacturing apparatus of the ninth aspect, the end portion of each of the punches is capable of independently placing a predetermined forming load upon the lead.

According to an eleventh aspect of the present invention, a method of manufacturing a semiconductor device comprises the steps of: placing a semiconductor device including a package and a lead projecting from the package on a die having a die-side forming surface of a predetermined configuration, with the lead in face-to-face relationship with the die-side forming surface; and bringing an end portion of a punch having a punch-side forming surface in face-to-face relationship with the die-side forming surface into contact with an opposite side of the lead from the die-side forming surface and moving the end portion of the punch substantially squarely toward the die-side forming surface, with the punch-side forming surface and the die-side forming surface maintained in parallel relationship.

Preferably, according to a twelfth aspect of the present invention, in the method of the eleventh aspect, the punch-side forming surface and the die-side forming surface hold the lead therebetween, with a predetermined forming load placed on the lead.

In accordance with the first aspect of the present invention, the end portion of the punch is moved substantially squarely toward the die-side forming surface to bend the lead. Thus, the apparatus of the first aspect of the present invention can reduce the sliding movement of the end portion on the lead, as compared with the background art semiconductor manufacturing apparatus. Thus, the apparatus of the first aspect can significantly reduce scratches on and metal plating removal from the lead resulting from the sliding movement, to consequently manufacture the semiconductor device which is free from troubles resulting from the lead scratches and the like and reliably exhibits its predetermined characteristic.

Additionally, the apparatus of the first aspect which thus reduces the sliding movement of the end portion on the lead requires a much smaller force developed by the sliding movement during the lead forming operation and operable to lift the semiconductor device than do the background art semiconductor manufacturing apparatus. As a result, the need to rigidly hold the lead between the stripper and the die of the background art semiconductor manufacturing apparatus to retain the semiconductor device on the die is eliminated.

In accordance with the second aspect of the present invention, the pressure detector and the controller can accurately control the load when the end portion and the die-side forming surface hold the lead therebetween. Thus, the apparatus of the second aspect can reliably place a predetermined forming load upon the lead held between the end portion and the die-side forming surface, to therefore form the lead of a predetermined configuration reliably and accurately.

In accordance with the third aspect of the present invention, when the end portion which is controlled based on only a relative amount of movement to move is deviated from its proper position, the apparatus of the third aspect can accommodate the deviation. In other words, the apparatus of the third aspect provides allowance in the action of the end portion coming into contact with the lead to place the above-mentioned predetermined forming load thereon. This alleviates the abrupt movement of the end portion resulting from the above-mentioned deviation. Therefore, the apparatus of the third aspect prevents damages to the lead due to the abrupt movement when the deviation occurs. Further, the resilient element accommodate s the above-mentioned deviation to ensure the loading operation.

In accordance with the fourth aspect of the present invention, when the semiconductor device has a plurality of leads projecting in different directions, the rotation of at least one of the punch, the die and the semiconductor device allows, for example, the single punch to form the leads. Therefore, the semiconductor manufacturing apparatus is provided at low costs.

The provision of punches for the respective directions in which the leads project requires a high accuracy of positioning of the punches in some cases. However, the smaller number of punches of the apparatus of the fourth aspect alleviates the positioning accuracy.

Further, when the semiconductor manufacturing apparatus comprises, for example, the single punch, the apparatus of the fourth aspect can flexibly meet the requirement of the manufacture of various types of semiconductor devices differing in size of the package or in the number of leads. Thus, the semiconductor manufacturing apparatus of the fourth aspect is very high in practicality and general versatility.

In accordance with the fifth aspect of the present invention, the retainer can adhere to the package under suction to reliably hold the semiconductor device. At this time, the apparatus of the fifth aspect does not hold the lead between the stripper and the die as has been done by the background art apparatus. Hence, the lead is not dented. Therefore, the apparatus of the fifth aspect can manufacture the semiconductor device which is free from troubles resulting from the dents on the lead and reliably exhibits its predetermined characteristic. Additionally, the apparatus of the fifth aspect, unlike the background art semiconductor manufacturing apparatus, need not correct the warpage and the like of the leads to perform the predetermined working operation since the retainer does not hold the lead on opposite side thereof. Thus, the apparatus of the fifth aspect can form the leads of the predetermined configuration reliably and accurately without being affected by the warpage, if any, in the leads.

Additionally, the rotative driver of the fourth aspect may be used to rotate the retainer, eliminating the need to remove the semiconductor device externally of the die to rotate the semiconductor device. This does not require the time to remove the semiconductor device externally of the die to shorten the manufacturing time.

In accordance with the sixth aspect of the present invention, contact is detected between the end portion of the punch and the die-side forming surface. When the end portion which is controlled based on only a relative amount of movement to move is deviated from its proper position before contacting the die-side forming surface, the apparatus of the sixth aspect can correct the positions of the end portion and the die-side forming surface relative to each other or the clearance therebetween when in contact. The contact detector may be also used to specify a contact home position between the punch-side forming surface and the die-side forming surface for pre-operation adjustment (without placing the semiconductor device in position). Thus, the use of the contact detector provides a precise predetermined clearance before and/or during the lead forming operation. Therefore, the apparatus of the sixth aspect can perform the predetermined working operation on the lead with accuracy, to consequently form the lead of the predetermined configuration reliably and accurately.

In accordance with the seventh aspect of the present invention, any one of the above described effects of the first to sixth aspects may be produced when the single punch is used to form the group of leads simultaneously. In particular, the apparatus of the seventh aspect can form the group of leads having uniform quality, that is, allows the distal portions of all of the leads to lie in the same plane when the semiconductor device is mounted on a circuit board. Therefore, the apparatus of the seventh aspect can manufacture the semiconductor device solderable with a sufficient bonding strength.

In accordance with the eighth aspect of the present invention, the apparatus can suppress or prevents forming troubles such as a lead skew and a twisted lead. Further, the apparatus of the eighth aspect is effective in that the leads are more difficult to reflect the deformation of the package than the leads all of which are connected together in the group. Therefore, the apparatus of the eight aspect can form the leads having the predetermined configuration reliably and accurately.

In accordance with the ninth aspect of the present invention, the plurality of punches are movable independently of each other to accommodate a difference in clearance between the punches and the dies resulting from, e.g., the dimensional accuracy thereof. Each of the punches can suitably perform the predetermined working operation. Hence, when the semiconductor device has, for example, a plurality of lead groups and the punch is provided for each of the lead groups, the apparatus of the ninth aspect eliminates variations in the configuration of the formed leads included in each lead group. Therefore, the leads having the predetermined configuration may be formed reliably and accurately throughout the semiconductor device.

In accordance with the tenth aspect of the present invention, the end portion of each of the punches is capable of independently placing the predetermined forming load upon the lead. This prevents the forming load from being affected by, e.g., the dimensional accuracy of the punch and the die or the number of leads formed by the single punch, unlike the background art semiconductor manufacturing apparatus. Therefore, the apparatus of the tenth aspect can place the predetermined forming load, i.e., a more sufficient load upon the lead than can the background art apparatus, to form the lead having the predetermined configuration reliably and accurately.

In accordance with the eleventh aspect of the present invention, the end portion of the punch is moved substantially squarely toward the die-side forming surface to bend the lead. Thus, the method of the eleventh aspect can reduce the sliding movement of the end portion on the lead, as compared with the background art method. Thus, the method of the eleventh aspect can significantly reduce scratches on and metal plating removal from the lead resulting from the sliding movement, to consequently manufacture the semiconductor device which is free from troubles resulting from the lead scratches and the like and reliably exhibits its predetermined characteristic.

In accordance with the twelfth aspect of the present invention, the lead is held on opposite sides with the predetermined forming load placed thereon without being affected by, e.g., the dimensional accuracy of the punch and the die or the number of leads formed by the single punch. Therefore, the method of the twelfth aspect can place a more sufficient load upon the lead than can the background art method, to form the lead having the predetermined configuration reliably and accurately.

It is therefore a primary object of the present invention to provide a semiconductor manufacturing apparatus and a method of manufacturing a semiconductor device which can significantly reduce scratches on and metal plating removal from a lead being formed, as compared with conventional semiconductor manufacturing apparatuses.

It is another object of the present invention to provide a semiconductor manufacturing apparatus and a method of manufacturing a semiconductor device which can form a lead of a predetermined configuration reliably and accurately.

It is still another object of the present invention to provide a highly practical, highly versatile and less expensive semiconductor manufacturing apparatus to accomplish the above described objects.

It is a further object of the present invention to provide a semiconductor manufacturing apparatus for manufacturing a semiconductor device solderable with a sufficient bonding strength.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
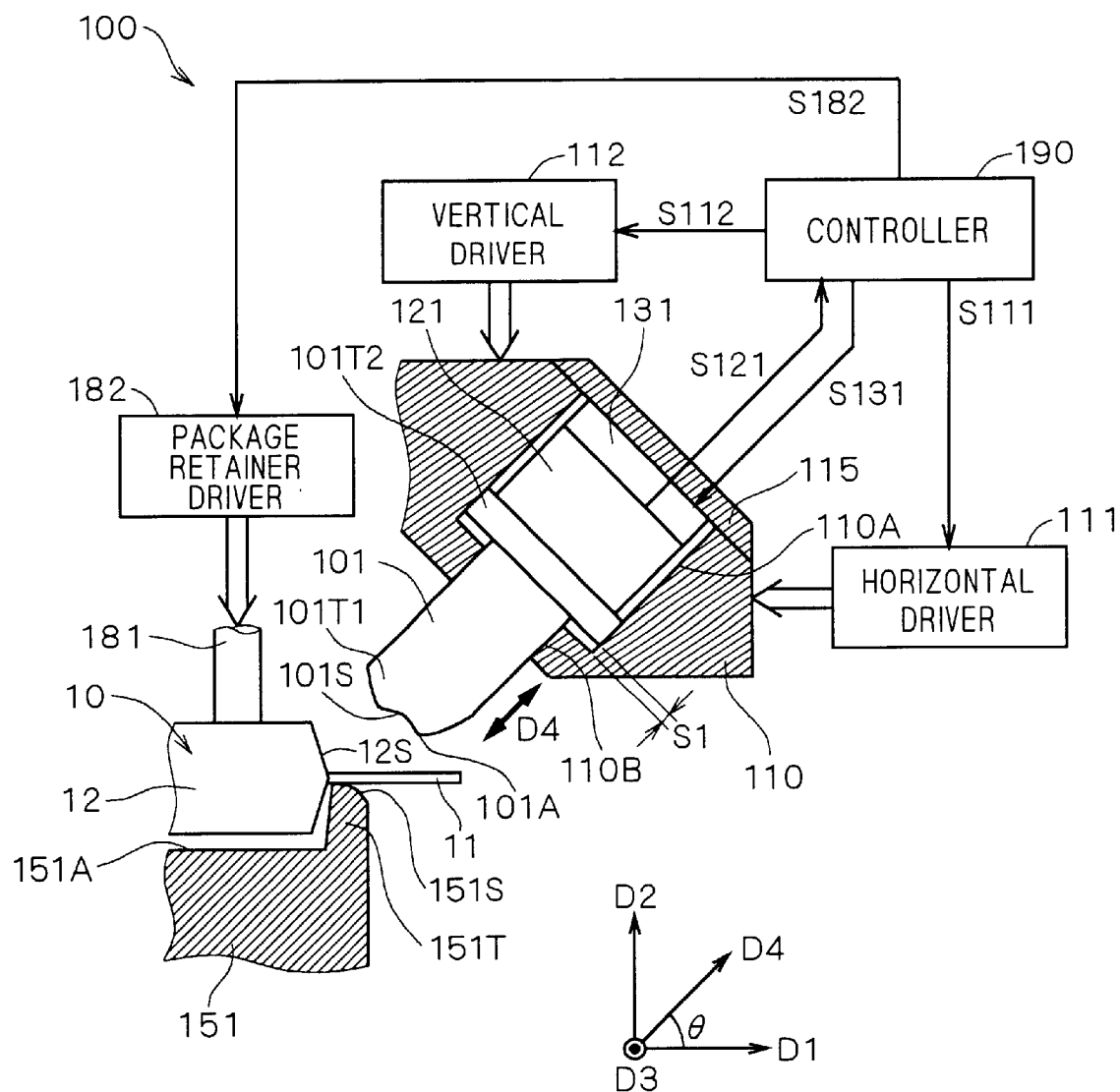
FIG. 1 is a schematic side view illustrating a first semiconductor manufacturing apparatus according to a first preferred embodiment of the present invention.

First Preferred Embodiment
A-1. Construction of First Semiconductor Manufacturing Apparatus FIG. 1 is a schematic side view (partially in cross section) of a first lead forming apparatus (semiconductor manufacturing apparatus) 100 according to a first preferred embodiment of the present invention. In FIG. 1, a sealed semiconductor device 10 is shown as placed on a die 151 to be described later. For purposes of convenience, it is assumed that a semiconductor device 10 has a plurality of leads 11 projecting from one end surface 12S of a package 12 in a first direction D1 (horizontal herein) perpendicular to a third direction D3 (horizontal herein) normal to the plane of FIG. 1. Linear leads 11 are shown in FIG. 1 as not yet having been formed into a predetermined configuration.

The following description, of course, applies to the semiconductor device having the single lead 11.

As illustrated in FIG. 1, the lead forming apparatus 100 basically comprises the die 151, and a punch 101 disposed in face-to-face relationship with the die 151, with the leads 11 therebetween. More specifically, the die 151 comprises a recess 151A shaped and sized to receive the package 12 of the semiconductor device 10 and for specifying the position of the semiconductor device 10 placed on the die 151, and an end portion 151T for defining the sidewall and opening of the recess 151A. The end portion 151T is engaged with parts of the respective leads 11 of the semiconductor device 10 which are near the package 12. A surface of the end portion 151T which extends from the opening end of the recess 151A in a direction opposite from the recess 151A serves as a die-side forming surface 151S. Thus, the semiconductor device 10 is received in the recess 151A so that the leads 11 are in face-to-face relationship with the die-side forming surface 151S. The configuration of the die-side forming surface 151S, i.e. the cross-sectional configuration of the end portion 151T, is defined based on a configuration into which the leads 11 are to be formed. The die 151 is placed in a predetermined position in the lead forming apparatus 100.

The punch 101 includes an end portion 101T1 closer to the die 151 and having a punch-side forming surface 101S similar in configuration to the die-side forming surface 151S. Part of the end portion 101T1 which moves closest to the leads 11 in a second direction D2 (vertical) perpendicular to the first and third directions D1 and D3 is referred to hereinafter as a "tip or tip surface 101A." An opposite end portion 101T2 of the punch 101 from the end portion 101T1 is of an overhanging configuration.

The punch 101 is housed in a punch holder 110, with the end portion 101T1 projecting outwardly therefrom. More specifically, the punch holder 110 is formed with a through hole comprising a hole 110B extending from a surface of the punch holder 110 which is closer to the die 151 to a predetermined depth, and a hole 110A communicating with the hole 110B and extending to the opposite surface of the punch holder 110. The hole 110A can receive the end portion 101T2 with clearance, and the hole 110B is shaped and sized to receive other than the end portion 101T2 and to be engaged with the end portion 101T2. The punch 101 is housed in such a through hole so that the end portion 101T1 projects out of the hole 110B and the end portion 101T2 rests in the hole 110A.

A pressurizer (driver) 131 including, for example, an electric to pressure (or displacement) transducer (known as a piezoelectric device), and a pressure detector 121 including, for example, a pressure (or displacement) to electric transducer such as a strain gauge are disposed in the hole 110A. The pressurizer 131 is constructed to move the end portion 101T1 toward the die-side forming surface 151S. The pressure detector 121 detects and measures a load or pressure applied to the punch 101 (accordingly to the end portion 101T1) by the pressurizer 131. The lead forming apparatus 100 is designed such that the above-mentioned pressurizer 131 moves the end portion 101T1 in a direction (referred to hereinafter as a "fourth direction D4") perpendicular to the third direction D3 and making a predetermined angle θ with the first direction D1. Therefore, the configuration of the holes 110A and 110B and the position of the punch holder 110 are specified based on the fourth direction D4.

The pressurizer 131 is controlled by a control signal S131 from a controller 190 including, for example, a microcomputer, and the pressure detector 121 outputs a detection signal S121 indicative of a detected pressure or information about the detected pressure to the controller 190. Based on the detection signal S121, the controller 190 controls the output (pressure or displacement) from the pressurizer 131, thereby to move the punch 101, i.e. the end portion 101T1, in the fourth direction D4. More specifically, when the pressurizer 131 is the electric to pressure transducer, the controller 190 can apply the control signal S131 indicative of a voltage value corresponding to a desired amount of movement to the pressurizer 131 to cause the end portion 101T1 to approach the die-side forming surface 151S in the fourth direction D4, and can stop applying the control signal S131 to stop the above approaching movement. Further, the controller 190 can control the output from the pressurizer 131 at a predetermined value when the leads 11 are held between the end portion 101T1 and the die-side forming surface 151S, to place a predetermined forming load upon the leads 11.

Although the pressure detector 121, rather than the pressurizer 131, is shown as disposed closer to the end portion 101T2, any one of the components 121 and 131 may be disposed closer to the end portion 101T2. In particular, so long as the pressurizer 131 and the pressure detector 121 can perform the above-mentioned functions, the pressurizer 131 and the pressure detector 121 may be disposed in various arrangements. For instance, the pressure detector 121 and the pressurizer 131 may be disposed externally of the hole 110A.

A lid or cap plate 115 closes the hole 110A, and is fixed. In FIG. 1, the punch 101, the pressure detector 121, the pressurizer 131 and the cap plate 115 are shown as coupled to each other. In such a case, a clearance S1 corresponding to a maximum distance moved by the punch 101 is created adjacent to the end portion 101T2 in the hole 110A. These components 101, 121, 131, 115 need not be coupled to each other but may be constructed to come into contact with each other to place a predetermined forming load upon the leads 11 when the leads 11 are held between the end portion 101T1 and the die-side forming surface 151S as will be described later.

The lead forming apparatus 100 further comprises a horizontal driver 111 for moving the punch holder 110 in the first direction D1, and a vertical driver 112 for moving the punch holder 110 in the second direction D2. Various known drive mechanisms such as an arrangement comprised of a servo motor and a ball screw mechanism are applicable as the drivers 111 and 112. The drivers 111 and 112 are controlled by control signals S111 and S112, respectively, from the controller 190. The controller 190 can properly control the drivers 111 and 112 to move the end portion 101T1 in various directions in a plane defined by the first and second directions D1 and D2. For example, the end portion 101T1 is movable along the die-side forming surface 151S.

The lead forming apparatus 100 further comprises a package retainer 181 for contact with the opposite side of the package 12 of the semiconductor device 10 from the die 151 to hold the semiconductor device 10 in conjunction with the die 151. The package retainer 181 is located, for example, to contact the package 12 at its center or near the end surface 12S thereof. The package retainer 181 may be made of various materials such as metal, elastic material and resin material. The package retainer 181 may include a spring mechanism or a suction mechanism to hold the semiconductor device 10 more reliably. The package retainer 181 is movable at least in the second direction D2 by a package retainer driver 182 controlled by a control signal S182 from the controller 190. Various known drive mechanisms are applicable as the package retainer driver 182, as well as the drivers 111 and 112.

In particular, the lead forming apparatus 100 does not have the body structure of the background art lead forming apparatuses 100P and 200P, but the punch holder 110, the package retainer 181, and the drivers 111, 112, 182 are disposed in respective predetermined positions in the lead forming apparatus 100. Controllers may be provided individually for the drivers 111, 112, 182, the pressurizer 131 and the pressure detector 121.

A-2. Operation of First Semiconductor Manufacturing Apparatus

Figure 2:
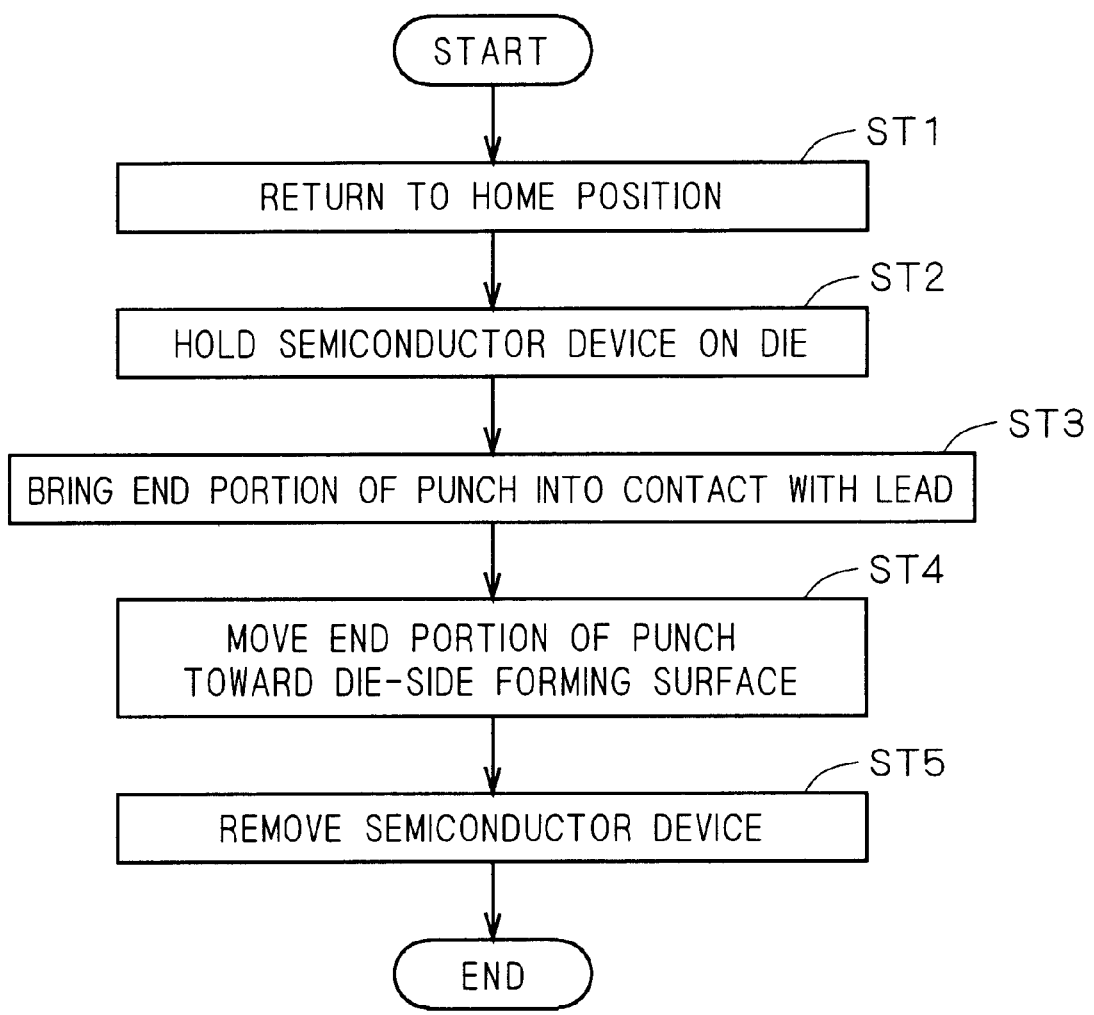
FIG. 2 is a flowchart illustrating the operation of the semiconductor manufacturing apparatus according to the first preferred embodiment.
Figure 3:
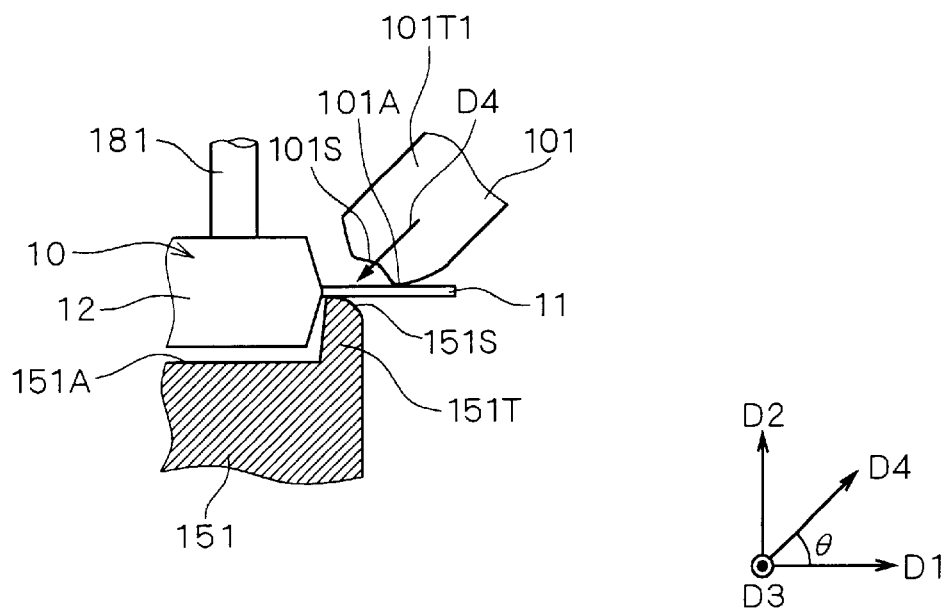
FIGS. 3 and 4 are schematic side views of principal parts of the first semiconductor manufacturing apparatus for illustrating the operation of the first semiconductor manufacturing apparatus according to the first preferred embodiment.
Figure 4:
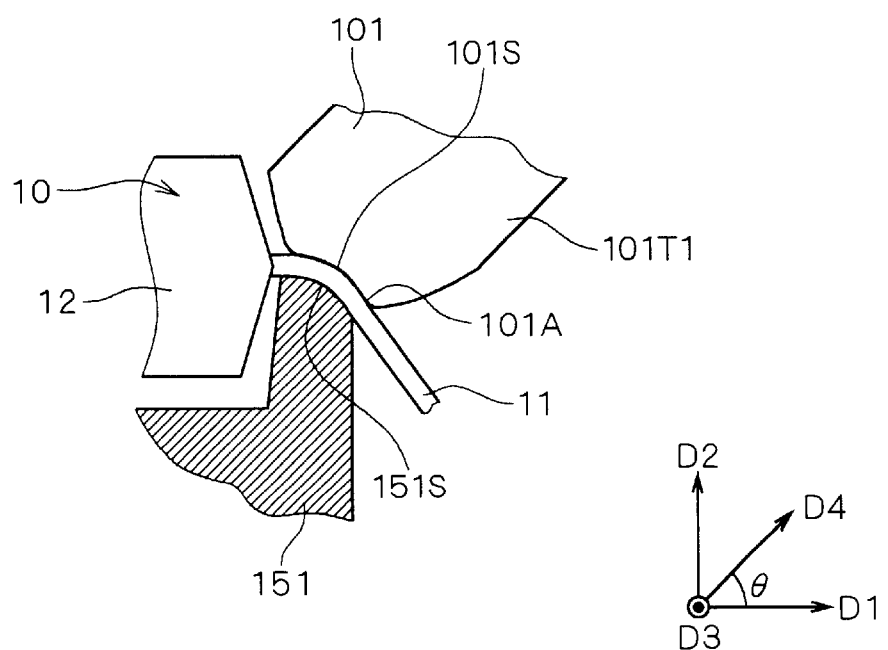

The operation of the lead forming apparatus 100 will be described with reference to FIGS. 2 through 4 in addition to FIG. 1. FIG. 2 is a flowchart illustrating the operation. FIGS. 3 and 4 are schematic side views of principal parts of the lead forming apparatus 100.

(Step ST1)

Initially, the movable components such as the punch holder 110 are returned to their respective home positions.

(Step ST2)

A transfer apparatus not shown places the semiconductor device 10 onto the die 151. In this step, the package 12 is positioned by insertion into the recess 151A and the semiconductor device 10 is placed so that the leads 11 are in face-to-face relationship with the die-side forming surface 151S. The package retainer 181 is moved downwardly to come into contact with the package 12. The semiconductor device 10 is retained on the die 151 by the contact. Such contact or retention is provided under a pressure which does not deform the package 12 and the leads 11.

(Step ST3)

The horizontal driver 111 and the vertical driver 112 are controlled to move the punch holder 110, bringing the tip 101A, i.e. the end portion 101T1, into contact with the leads 11 at their predetermined position. In this step, the movement of the end portion 101T1 is controlled so that the punch-side forming surface 101S and the die-side forming surface 151S are parallel to each other with a predetermined clearance therebetween.

(Step ST4)

With the tip 101A in contact with the leads 11, the pressurizer 131 moves the end portion 101T1 in the fourth direction D4 substantially squarely toward the die-side forming surface 151S while the parallel relation is maintained between the punch-side forming surface 101S and the die-side forming surface 151S. The term "squarely" used herein is intended to mean a manner which allows the forming surfaces 101S and 151S to come into proper engagement with each other when the punch-side forming surface 101S is moved in the fourth direction D4 into contact with the die-side forming surface 151S. At the end of Step ST3, the end portion 101T1 is moved so as to contact the lead 11 substantially in front of the die-side forming surface 151S. The end portion 101T1 which moves in the fourth direction D4 differs from the end portion 101T1P of the background art lead forming apparatus 100P in that it does not slide on the leads in accordance with the pivotal movement and its associated downward movement. Thus, the amount of sliding movement of the end portion 101T1 on the leads 11 is significantly less than that of the background art end portion.

Steps ST3 and ST4 may be seized as the combined step of bringing the end portion 101T1 into contact with the leads 11 and moving the end portion 101T1 substantially squarely toward the die-side forming surface 151S, with the parallel relation maintained between the punch-side forming surface 101S and the die-side forming surface 151S. In this case, the combined step is performed in a manner described below. First, the horizontal driver 111 and the vertical driver 112 are controlled to move the punch-side forming surface 101S to the front of the die-side forming surface 151S. At this point of time, the end portion 101T1 is out of contact with the leads 11. Then, the pressurizer 131 is controlled to bring the end portion 101T1 into contact with the leads 11 in the course of the movement of the end portion 101T1 toward the die-side forming surface 151S.

This causes the leads 11 to be held between the end portion 101T1, more specifically the punch-side forming surface 101S, and the die-side forming surface 151S (as shown in FIG. 4). In particular, the lead forming apparatus 100 places a predetermined forming load upon the leads 11 to hold the leads 11 between the forming surfaces 101S and 151S. This insures the bending of parts of the respective leads 11 which are near the package 12 into a configuration conforming to the forming surfaces 151S and 101S.

More specifically, the controller 190 controls the pressurizer 131 to transmit the output from the pressurizer 131 through the pressure detector 121 to the punch 101. This moves the punch 101 and accordingly the end portion 101T1 toward the die-side forming surface 151S. During this operation, the pressure detector 121 detects the load placed on the punch 101, and the controller 190 monitors the value of the load. In particular, the controller 190 controls the pressurizer 131 so that this load acts as the predetermined forming load placed on the leads 11 held between the forming surfaces 151S and 101S (See FIG. 4). Thereafter, the output of the pressurizer 131 is stopped. This completes the operation of holding the leads 11 between the forming surfaces 151S and 101S or the forming operation of the lead forming apparatus 100.

(Step ST5)

The punch holder 110 and the package retainer 181 are moved away from the semiconductor device 10. Then, the semiconductor device 10 is removed from the die 151.

The first lead forming apparatus 100 is constructed so that the horizontal driver 111 and the vertical driver 112 move the end portion 101T1 in the first and second directions D1 and D2. However, so long as the above described positional relationship between the leads 11, the end portion 101T1 and the die-side forming surface 151S relative to each other is accomplished, the die-side forming surface 151S (and accordingly the die 151) or both of the end portion 101T1 and the die-side forming surface 151S may be rendered movable in the first and second directions D1 and D2. Further, so long as the above described positional relationship is accomplished, the second direction D2 may be other than the vertical. This applies to a second lead forming apparatus 200 to be described below.

B-1. Construction of Second Semiconductor Manufacturing Apparatus

Figure 5:
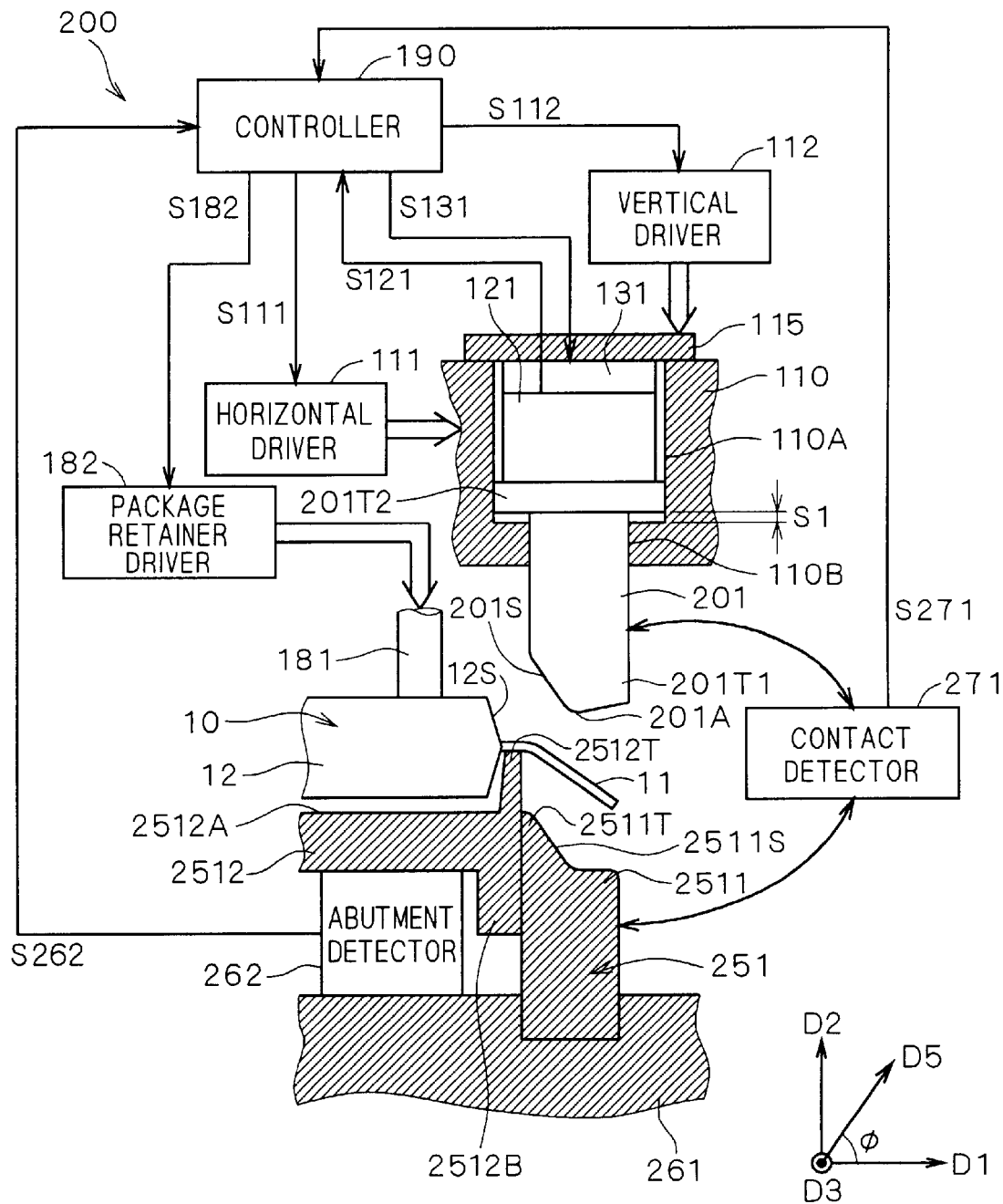
FIG. 5 is a schematic side view illustrating a second semiconductor manufacturing apparatus according to the first preferred embodiment.

After the first lead forming apparatus 100 forms shoulders of the respective leads 11, the second lead forming apparatus (semiconductor manufacturing apparatus) 200 shown in side view of FIG. 5 forms distal portions of the respective leads 11. The construction and operation of the second lead forming apparatus 200 will be described hereinafter. Like reference numerals and characters are used to designate components identical with those described above, and the above detailed description thereon shall apply to the second lead forming apparatus 200.

With reference to FIG. 5, the lead forming apparatus 200 comprises a die 251 corresponding to the die 151 (shown in FIG. 1) and including a forming block 2511 and a positioning block 2512. Assuming that the die 151 shown in FIG. 1 is divided into two parts by a boundary extending through the end portion 151T in the second direction D2, the forming block 2511 and the positioning block 2512 correspond to a part of the die 151 which includes the die-side forming surface 151S and a part thereof which includes the recess 151A, respectively.

More specifically, the forming block 2511 has an end portion 2511T projecting in the second direction D2, and the surface of the end portion 2511T serves as a die-side forming surface 2511S conforming to the final configuration of the distal portions of the leads. The forming block 2511 is fixed to a die holder 261. On the other hand, the positioning block 2512 has an end portion 2512T projecting in the second direction D2 and defining a recess 2512A corresponding to the above-mentioned recess 151A (shown in FIG. 1). The positioning block 2512 is disposed so that the end portion 2512T thereof contacts the end portion 2511T, and is movable in the second direction D2.

A resilient element (not shown) such as a spring is disposed between the positioning block 2512 and the die holder 261. The resilient element urges the positioning block 2512 in the opposite direction from the die holder 261. The die holder 261 is disposed in a predetermined position in the lead forming apparatus 200.

Figure 6:
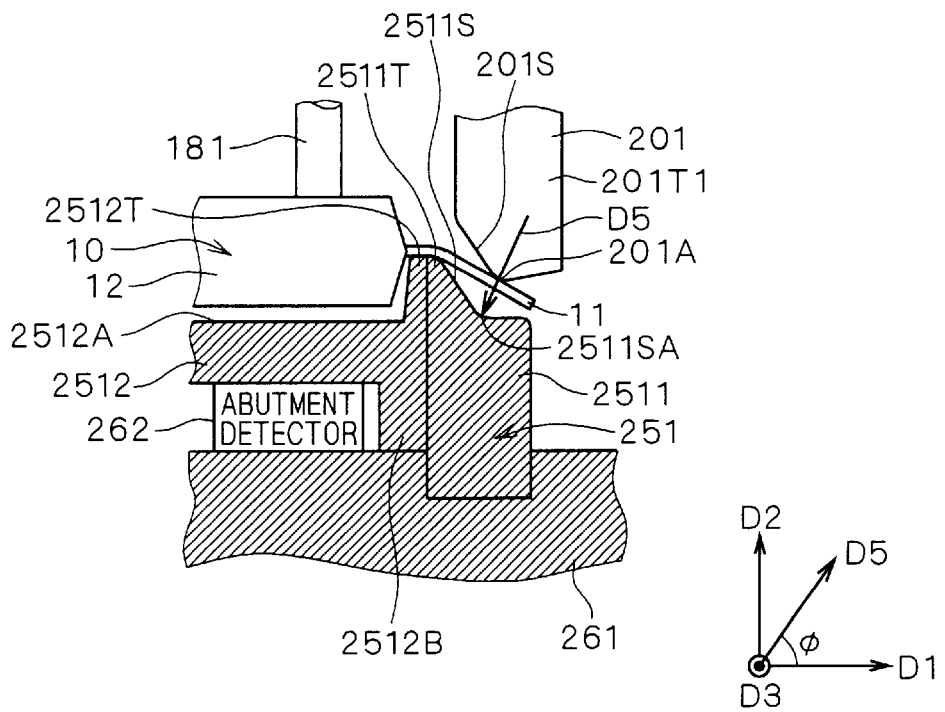
FIGS. 6 and 7 are schematic side views of principal parts of the second semiconductor manufacturing apparatus for illustrating the operation of the second semiconductor manufacturing apparatus according to the first preferred embodiment.

The blocks 2511 and 2512 are sized as viewed in the second direction D2 so that the end portions 2511T and 2512T are equal in height when a lowermost end portion 2512B of the positioning block 2512 is in abutment with the die holder 261, as illustrated in FIG. 6. In other words, the blocks 2511 and 2512 are sized as viewed in the second direction D2 so that the end portions 2511T and 2512T constitute the end portion 151T of the die 151 of FIG. 1 in the above-mentioned abutting relationship.

The lead forming apparatus 200 further comprises an abutment detector 262 for detecting the abutment between the lowermost end portion 2512B and the die holder 261. The abutment detector 262 may employ various sensors, e.g. a sensor for directly detecting the abutment mechanically, electrically or optically and a velocity sensor for detecting that the positioning block 2512 comes to a stop upon abutment with the die holder 261. The abutment detector 262 outputs a detection signal S262 to the controller 190. Although the abutment detector 262 is schematically shown as disposed between the positioning block 2512 and the die holder 261 in FIG. 5, it is needless to say that the abutment detector 262 is disposed in a suitable position depending on sensor types.

The lead forming apparatus 200 further comprises a punch 201 such that an end portion 201T1 corresponding to the above-mentioned end portion 101T1 (shown in FIG. 1) has a punch-side forming surface 201S similar in configuration to the die-side forming surface 2511S. An opposite end portion 201T2 of the punch 201 from the end portion 201T1 is of an overhanging configuration. Part of the end portion 201T1 which moves closest to the leads 11 in the second direction D2 is referred to hereinafter as a "tip or tip surface 201A," like the above-mentioned tip 101A.

The punch 201, similar to the punch 101, is housed in the punch holder 110 of the lead forming apparatus 200. The punch holder 110 (and accordingly the end portion 201T1) is movable in the plane defined by the first and second directions D1 and D2, e.g., along the die-side forming surface 2511S under the control of the drivers 111 and 112. The lead forming apparatus 200 further comprises the pressurizer 131 and the pressure detector 121. The end portion 201T1, i.e. the punch 201, is movable in the second direction D2.

The lead forming apparatus 200 further comprises a contact detector 271 for detecting contact between the punch 201 and the die 251, with the leads 11 therebetween. More specifically, the contact detector 271 detects contact between the punch 201 and the forming block 2511. The contact detector 271 may employ various sensors, e.g. a electric sensor for detecting an electric conduction between the punch 201 and the forming block 2511 to detect the contact. The contact detector 271 outputs a detection signal S271 to the controller 190.

The lead forming apparatus 200 further comprises the package retainer 181, and the package retainer driver 182. In particular, the lead forming apparatus 200 does not have the body structure of the background art lead forming apparatuses 100P and 200P, but the punch holder 110, the package retainer 181 and the drivers 111, 112, 182 are disposed in respective predetermined positions in the lead forming apparatus 200.

B-2. Operation of Second Semiconductor Manufacturing Apparatus

Figure 7:
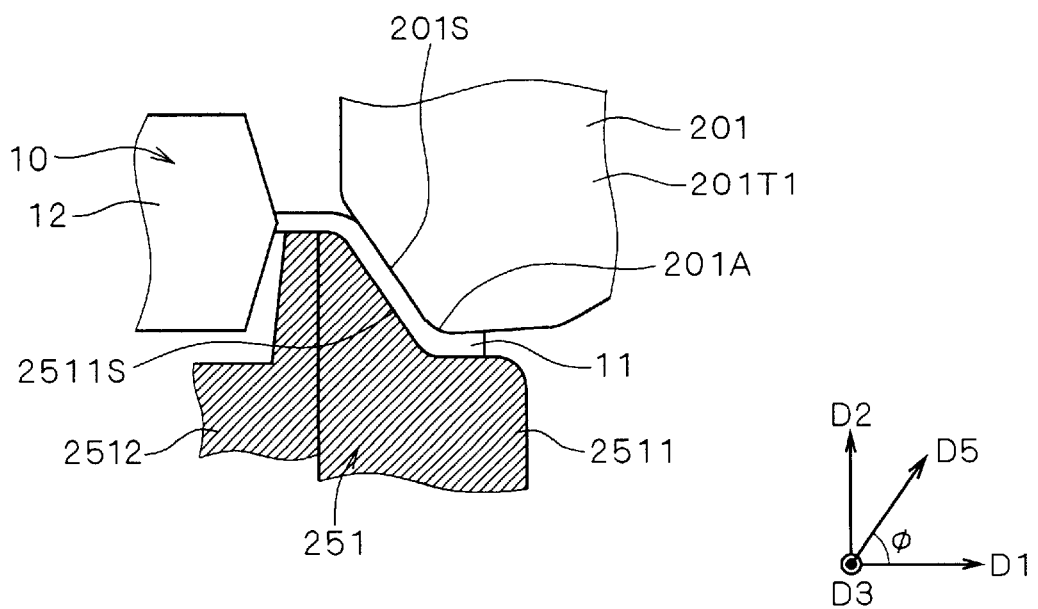

The operation of the lead forming apparatus 200 will be described with reference to FIGS. 6 and 7 in addition to FIG. 5. FIGS. 6 and 7 are schematic side views of principal parts of the lead forming apparatus 200. Since the lead forming apparatus 200 is similar in basic operation to the apparatus 100, the flowchart shown in FIG. 2 is also referred to.

(Step ST1)

Initially, the movable components such as the punch holder 110 are returned to their respective home positions. In this step, the resilient element urges the lowermost end portion 2512B of the positioning block 2512 so that the lowermost end portion 2512B is not in abutment with the die holder 261 but is at a predetermined height.

(Step ST2)

A transfer apparatus not shown places the semiconductor device 10 onto the positioning block 2512. In this step, the semiconductor device 10 is placed so that the leads 11 are in face-to-face relationship with the die-side forming surface 2511S. The package retainer 181 is moved downwardly to come into contact with the package 12. With the contacting relation maintained, the package retainer 181 is moved further downwardly to move the positioning block 2512 downwardly with a constant package retaining force. When the abutment detector 262 detects the abutment of the lowermost end portion 2512B against the die holder 261 (as shown in FIG. 6) and the controller 190 receives the detection signal S262, the controller 190 controls the package retainer driver 182 to stop the package retainer 181. The above described sequential operations causes the semiconductor device 10 to be retained on the die 251, with the leads 11 in face-to-face relationship with the die-side forming surface 2511S.

The positioning block 2512 may be moved using an arrangement to be described below in place of the resilient element. Specifically, a positioning block driver similar in construction to the drivers 111, 112, 182 may be controlled by a control signal from a positioning block driver controller to move the positioning block 2512. The controller 190 may has the function of the positioning block driver controller. The positioning block 2512 and the package retainer 181 move in operative association with each other.

(Step ST3)

The horizontal driver 111 and the vertical driver 112 are controlled to move the punch holder 110, bringing the tip 201A, i.e. the end portion 201T1, into contact with the leads 11 at their predetermined position, as shown in FIG. 6. Next, the tip 201A is moved toward a tip bending portion 2511SA of the die-side forming surface 2511S which is of a most sharply curved configuration. More specifically, the horizontal driver 111 and the vertical driver 112 are controlled to move the end portion 201T1 in a fifth direction D5 (perpendicular to the third direction D3 and making a predetermined angle φ with the first direction D1) in which a line connecting the tip 201A and the tip bending portion 2511SA extends. The movement of the end portion 201T1 is stopped when the punch-side forming surface 201S and the die-side forming surface 2511S are parallel to each other with a predetermined clearance therebetween.

(Step ST4)

With the tip 201A in contact with the leads 11, the pressurizer 131 moves the end portion 201T1 in the second direction D2 substantially squarely toward the die-side forming surface 2511S while the parallel relation is maintained between the punch-side forming surface 201S and the die-side forming surface 2511S. The term "squarely" used herein is intended to mean a manner which allows the forming surfaces 201S and 2511S to come into proper engagement with each other when the punch-side forming surface 201S is moved in the second direction D2 into contact with the die-side forming surface 2511S. At the end of Step ST3, the end portion 201T1 is moved so as to contact the lead 11 substantially in front of the die-side forming surface 2511S. The end portion 201T1 of the lead forming apparatus 200 differs from the end portion 201T1P of the background art lead forming apparatus 200P in that it does not slide on the leads in accordance with the pivotal movement and its associated downward movement. Thus, the amount of sliding movement of the end portion 201T1 on the leads 11 is significantly less than that of the background art end portion.

As in the first lead forming apparatus 100, Steps ST3 and ST4 may be seized as the combined step. In this case, the combined step is performed in a manner described below. First, the punch-side forming surface 201S is moved to the front of the die-side forming surface 2511S. At this point of time, the end portion 201T1 is out of contact with the leads 11. Then, the pressurizer 131 is controlled to bring the end portion 201T1 into contact with the leads 11 in the course of the movement of the end portion 201T1 toward the die-side forming surface 2511S.

This causes the leads 11 (at their distal portions) to be held between the end portion 201T1 and the die-side forming surface 2511S (as shown in FIG. 7). Like the first lead forming apparatus 100, the lead forming apparatus 200 places a predetermined forming load upon the leads 11 to hold the leads 11 between the end portion 201T1 and the die-side forming surface 2511S. This allows the bending of parts of the respective leads 11 which are near the package 12 into a configuration conforming to the forming surfaces 2511S and 201S, providing the leads 11 having the final configuration.

The second lead forming apparatus 200 may be adapted to establish the configuration of the end portion 201T1 of the punch 201 and the position of the punch holder 110 so that the pressurizer 131 moves the end portion 201T1 in the fifth direction D5, thereby to perform an operation similar to that of the first lead forming apparatus 100. More specifically, in Step ST3, the horizontal driver 111 and the vertical driver 112 are controlled to bring the end portion 201T1 into contact with the leads 11 at their predetermined position. With the contacting relationship maintained, the pressurizer 131 moves the end portion 201T1 in the fifth direction D5 substantially squarely toward the die-side forming surface 2511S while the parallel relation is maintained between the punch-side forming surface 201S and the die-side forming surface 2511S. The above-mentioned combined step including Steps ST3 and ST4 may be also applied to such an arrangement.

(Step ST5)

The punch holder 110 and the package retainer 181 are moved away from the semiconductor device 10. Then, the semiconductor device 10 is removed from the die 251. The semiconductor device 10 having the leads 11 of the predetermined configuration is finished by the above discussed operations of the first and second lead forming apparatuses 100 and 200.

The lead forming apparatuses 100 and 200 produce effects to be described below. In the lead forming apparatuses 100 and 200, the end portions 101T1 and 201T1 of the punches 101 and 201 are moved toward the die-side forming surfaces 151S1 and 2511S in Step ST4 This reduces the sliding movement of the end portions 101T1 and 201T1 on the leads 11, as compared with that in the background art apparatuses 100P and 200P. Therefore, the lead forming apparatuses 100 and 200 can significantly reduce scratches on and metal plating removal from the formed leads 11 resulting from the sliding movement.

Figure 8:
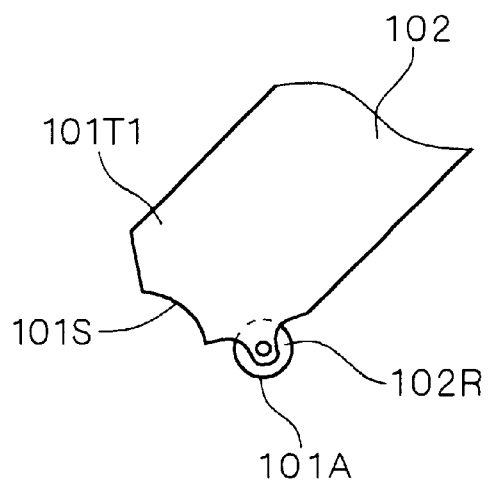
FIG. 8 is a schematic side view illustrating another form of the semiconductor manufacturing apparatus according to the first preferred embodiment.

As illustrated in FIG. 8, the end portion 101T1 of the punch 102 may be provided with a roller 102R which performs the function of the tip 101A to further reduce or completely eliminate the above sliding movement.

The lead forming apparatuses 100 and 200 thus reduce the sliding movement of the end portion 101T1 on the leads 11 to require a much smaller force developed by the sliding movement during the lead forming operation and operable to lift the semiconductor device 10 than do the background art lead forming apparatuses 100P and 200P. As a result, the need to rigidly hold the leads 11 between the stripper 181P and the die 151P as in the background art lead forming apparatuses 100P and 200P is eliminated. Thus, the package retainer 181 of the lead forming apparatuses 100 and 200 can hold the semiconductor device 10. Since the package retainer 181 comes into contact with the package 12, the leads are not held between the stripper 181P and the die 151P of the background art apparatuses 100P and 200P. Hence, the leads 11 are not dented.

Consequently, the lead forming apparatuses 100 and 200 can manufacture the semiconductor device which is free from troubles resulting from the scratches or dents on the leads 11 and reliably exhibits its predetermined characteristic.

Further, the pressurizer 131, the pressure detector 121 and the controller 190 of the lead forming apparatuses 100 and 200 can accurately control the load under which the leads are held. That is, the leads 11 are reliably held under the predetermined forming load. This prevents the forming load from being affected by, e.g., the dimensional accuracy of the punch or the die or the number of leads formed by the single punch, unlike the background art lead forming apparatuses 100P and 200P. Therefore, the lead forming apparatuses 100 and 200 can place a more sufficient load upon the leads 11 than can the background art lead forming apparatuses 100P and 200P, to form the leads 11 of the predetermined configuration reliably and accurately.

Additionally, the lead forming apparatuses 100 and 200, unlike the background art lead forming apparatuses 100P and 200P, need not correct the warpage and the like of the leads 11 to form the leads 11 since the package retainer 181 contacts the package 12. Thus, the apparatuses 100 and 200 can form the leads 11 of the predetermined configuration reliably and accurately without being affected by the warpage, if any, in the array of leads 11.

In the lead forming apparatus 200, the contact detector 271 detects the contact between the end portion 201T1 and the die-side forming surface 2511S. When the end portion 201T1 which is controlled based on only a relative amount of movement to move is deviated from its proper position before contacting the die-side forming surface 2511S, the lead forming apparatus 200 can correct the position of the end portion 201T1 and the die-side forming surface 2511S relative to each other or the clearance therebetween when the contacting relation is established. The contact detector 271 may be also used to specify the contacting or engaging relation (or a contact home position) between the punch-side forming surface 201S and the die-side forming surface 2511S for pre-operation adjustment (without placing the semiconductor device 10 on the positioning block 2512). Thus, the use of the contact detector 271 provides a precise predetermined clearance before and/or during the lead forming operation. Therefore, the lead forming apparatus 200 can form the leads of the predetermined configuration reliably and accurately. It will be apparent that the lead forming apparatus 100 may also comprise the contact detector 271.

Thus, the lead forming apparatuses 100 and 200 can form the plurality of leads into the predetermined configuration reliably and accurately. The distal portions of all leads lie in the same plane when the semiconductor device is mounted on a circuit board. Therefore, the apparatuses 100 and 200 can manufacture the semiconductor device solderable with a sufficient bonding strength.

The lead forming apparatuses 100 and 200 does not have a conventional body structure comprised of upper and lower bodies of the background art apparatuses 100P and 200P. A change in, e.g., dimension of the semiconductor device 10 requires only the replacement of the components such as the punches 101, 201 and the dies 151, 251 or the adjustment of the positions of the components. The need to replace the entire upper and lower bodies as in the background art lead forming apparatuses 100P and 200P is eliminated. This provides the lead forming apparatuses at very low costs.

The clearance S1 in the punch holder 110 produces an effect to be described below. When the end portions 101T1 and 201T1 which are controlled based on only a relative amount of movement to move are deviated from their proper positions, more particularly when the clearances between the punches 101, 201 and the dies 151, 251 deviate from respective predetermined values, the clearance S1 accommodates the deviations. In other words, the clearance S1 provides allowance in the action of the end portions 101T1 and 201T1 coming into contact with the leads 11 to place the above-mentioned predetermined forming load thereon. This alleviates the abrupt movement or operation timing shift of the end portions 101T1 and 201T1 resulting from the above-mentioned deviations. Therefore, the clearance S1 prevents damages to the leads due to the abrupt movement. Further, the clearance S1 accommodates the above-mentioned deviations to ensure the loading operation.

Second Preferred Embodiment

The leads 11 projecting from the single end surface 12S of the package 12 is described in the first preferred embodiment. The lead forming apparatuses 100 and 200 flexibly meet the requirement of forming the leads 11 projecting from at least two end surfaces 12S of the package 12 to manufacture the semiconductor device 10 shown in FIG. 9.

Figure 9:
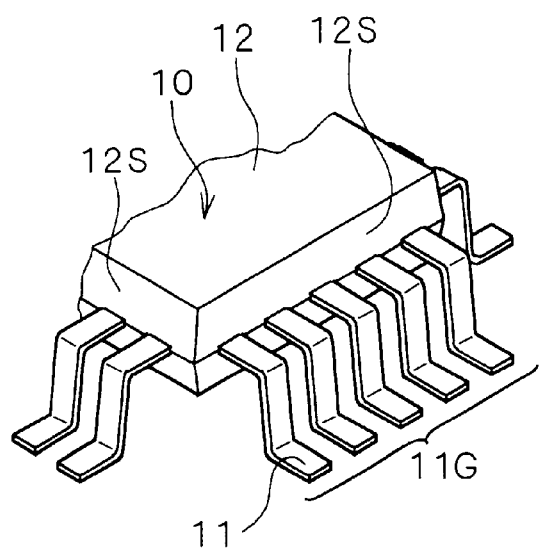
FIG. 9 is a schematic perspective view of a semiconductor device manufactured by the semiconductor manufacturing apparatus according to a second preferred embodiment of the present invention.

The apparatuses 100, 200 may comprise independently movable punches 101 and 201 provided for each group of leads 11 projecting from the single end surface 12S or projecting substantially in the same direction (See a lead group 11G of FIG. 9) to manufacture the semiconductor device 10 shown in FIG. 9.

With such an arrangement, the plurality of punches 101, 201 are movable independently of each other to accommodate the difference in clearance between the punches 101, 201 and the dies 151, 251 resulting from, e.g., the dimensional accuracy thereof. Each of the punches 101, 201 can suitably perform the forming operation to eliminate variations in the configuration of the formed lead 11 included in each lead group 11G. Therefore, the leads 11 having the predetermined configuration are formed reliably and accurately throughout the semiconductor device 10.

Alternatively, the apparatuses 100, 200 may comprise a rotative driver (not shown) for rotating at least one of the punches 101, 201, dies 151, 251 and the semiconductor device 10. More specifically, the rotative driver is used to rotate, e.g., the punch holder 110 about the package 12, with relative positional relationship maintained between the punches 101, 201, the dies 151, 251 and the semiconductor device 10, to thereby rotate the punches 101, 201. As the punches 101, 201 are rotated, the leads 11 included in the lead groups 11G are sequentially formed for the manufacture of the semiconductor device 10 shown in FIG. 9. When the package retainer 181 has a suction mechanism, the package retainer 181 with the semiconductor device 10 adhering thereto under suction may be moved upwardly in the second direction D2, and the rotative driver may rotate the semiconductor device 10 so that the semiconductor device 10 does not collide with the dies 151, 251 and the like. With such an arrangement, there is no need to remove the semiconductor device 10 externally of the dies 151, 251 to rotate the semiconductor device 10. This does not require the time to remove the semiconductor device 10 externally of the dies 151, 251, to shorten the manufacturing time.

The provision of the rotative driver allows the lead forming operation using the punches 101, 201 the number of which is less than the number of lead groups 11G when the semiconductor device 10 has the plurality of lead groups 11G projecting in different directions. For example, the single punch 101 or 201 or two punches 101 or 201 provided for two parallel end surfaces 12S respectively may be used to form the leads 11 projecting in two or four directions such as those of a SOP (Small Outline Package) or a QFP (Quad Flat Package). The number of punches 101, 201 and their driving components is smaller, and the lead forming apparatuses 100, 200 are provided at accordingly lower costs.

The provision of the punches 101, 201 for each end surface 12S requires a high accuracy of positioning of the punches 101, 201 in some cases. However, the smaller number of punches 101, 201 alleviates the positioning accuracy.

Further, in the case of, e.g., the single punches 101, 201, the lead forming apparatuses 100, 200 can flexibly meet the requirements of the manufacture of various types of semiconductor devices differing in size of the package 12 or in the number of leads 11. Thus, the lead forming apparatuses 100, 200 of such a construction are very high in general versatility.

First Common Modification of First and Second Preferred Embodiments

Figure 10:
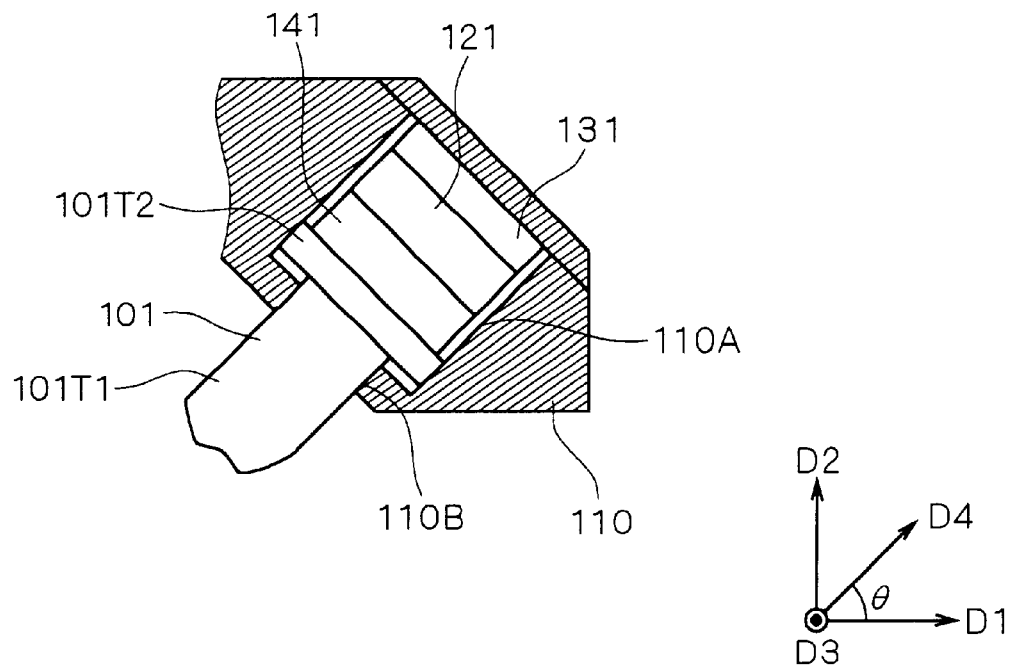
FIG. 10 is a schematic side view illustrating another form of the semiconductor manufacturing apparatus according to a first modification common to the first and second preferred embodiments.

As illustrated in the side view of FIG. 10, the lead forming apparatus 100 may further comprise a resilient element 141 between the end portion 101T2 of the punch 101 and the pressure detector 121 to produce an effect to be described below. When the end portion 101T1 which is controlled based on only a relative amount of movement to move is deviated from its proper position, more particularly when the clearance between the punch 101 and the die 151 deviates from a predetermined value, the resilient element 141 accommodates the deviation. In other words, the resilient element 141 provides allowance in the action of the end portion 101T1 coming into contact with the leads 11 to place the above-mentioned predetermined forming load thereon. This alleviates the abrupt movement or operation timing shift of the end portion 101T1 resulting from the above-mentioned deviation. Therefore, the resilient element 141 prevents damages to the leads due to the abrupt movement. Further, the resilient element 141 accommodates the above-mentioned deviation to ensure the loading operation.

The resilient element 141 may be disposed between the end portion 101T2 and the pressurizer 131, and be applied to the lead forming apparatus 200.

Second Common Modification of First and Second Preferred Embodiments

Figure 11:
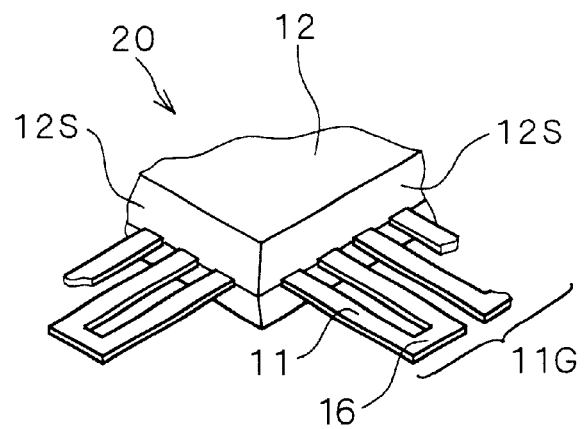
FIGS. 11 and 12 are schematic perspective views of the semiconductor device according to a second modification common to the first and second preferred embodiments.

The above discussed lead forming apparatuses can form the leads of a semiconductor device 20 shown in FIG. 11. As illustrated in FIG. 11, the semiconductor device 20 comprises the plurality of leads 11 included in the lead group 11G and divided into at least two blocks (each having two leads in FIG. 11), with a connection 16 connecting the tips of adjacent leads 11. The semiconductor device 20 may be manufactured by the use of a leadframe having the connection 16. Alternatively, after the step of sealing a semiconductor device using such a leadframe that all of the plurality of leads 11 included in the lead group 11G are connected together, the connection 16 may be formed from the part connecting all of the leads 11 in the subsequent cutting step for producing the leads 11.

Figure 12:
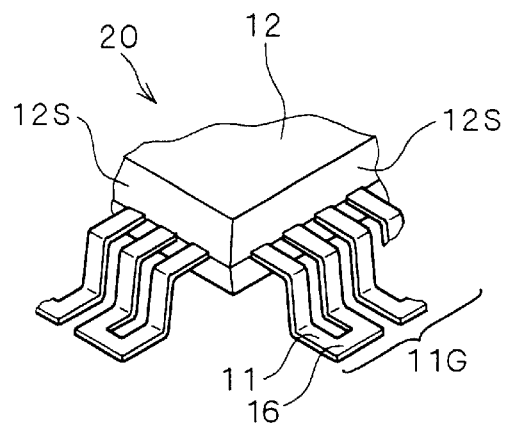
Figure 13:
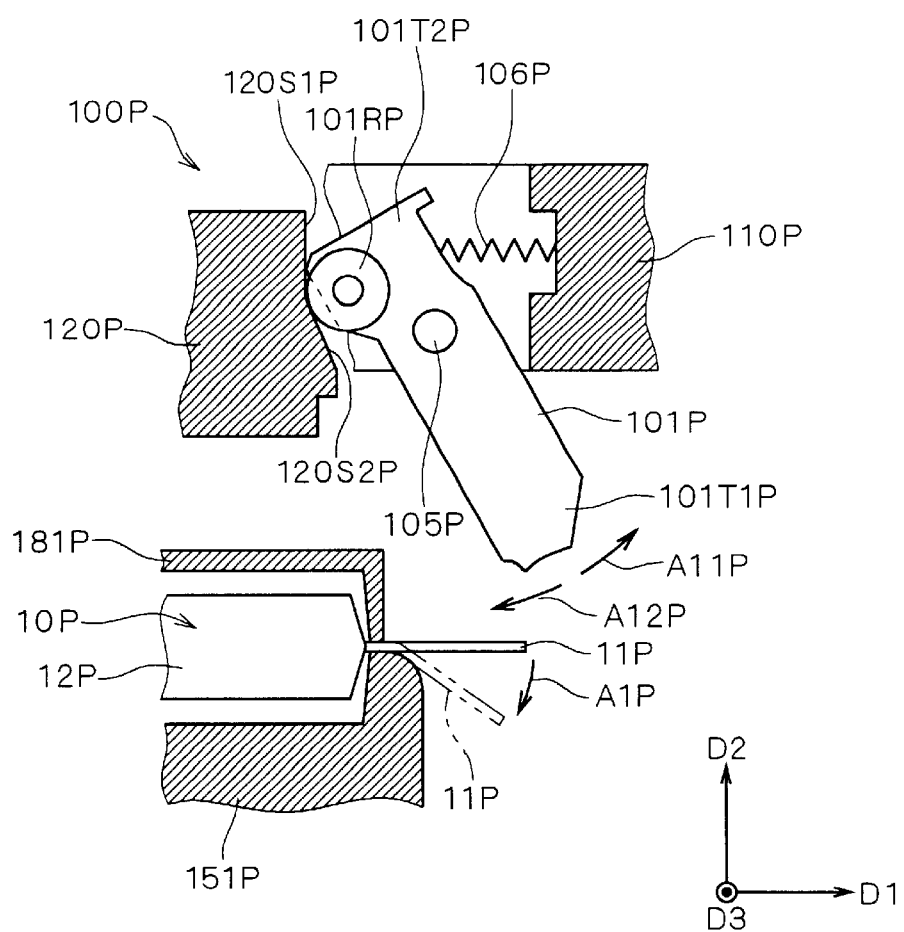
FIG. 13 is a schematic side view of a first background art semiconductor manufacturing apparatus.
Figure 14:
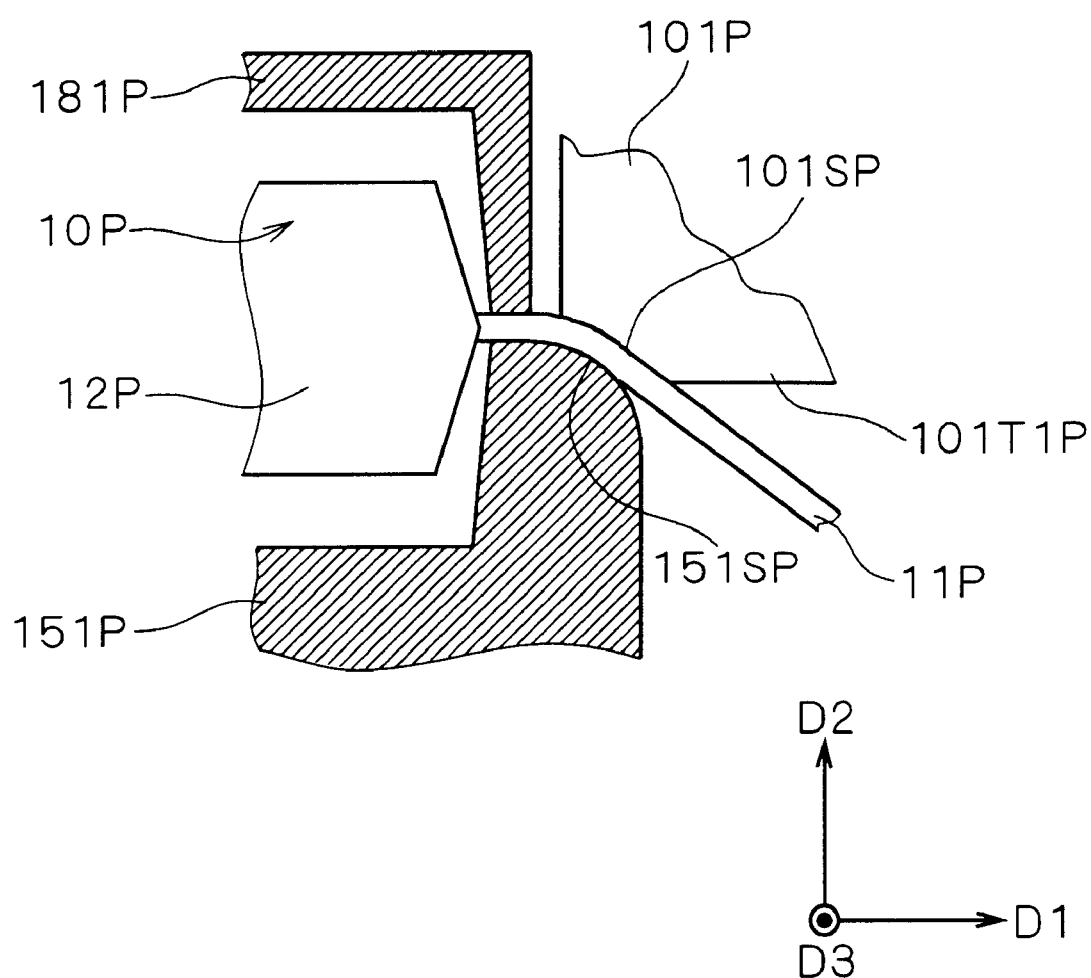
FIG. 14 is a schematic side view of principal parts of the first background art semiconductor manufacturing apparatus for illustrating the operation thereof.
Figure 15:
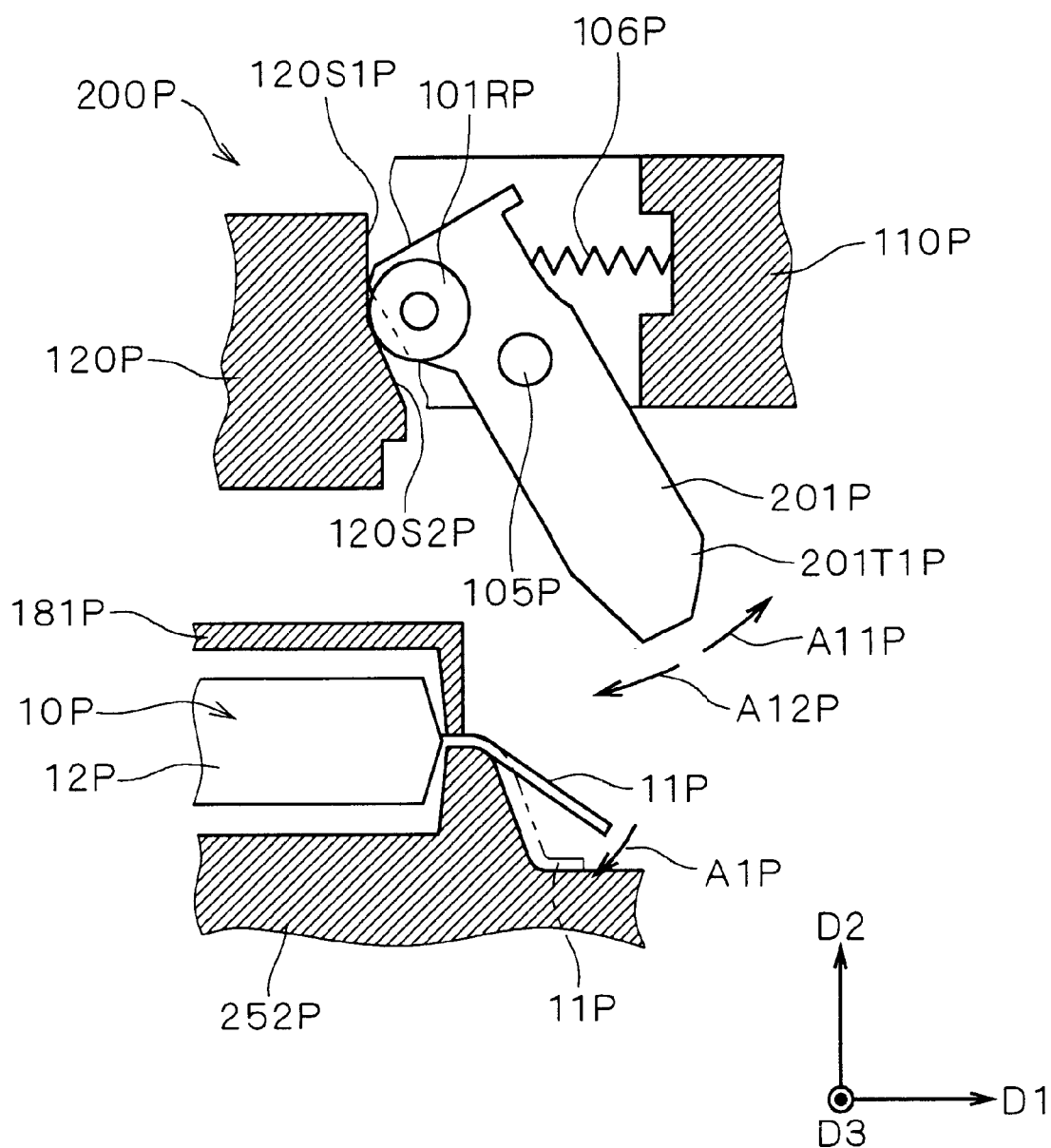
FIG. 15 is a schematic side view of a second background art semiconductor manufacturing apparatus.
Figure 16:
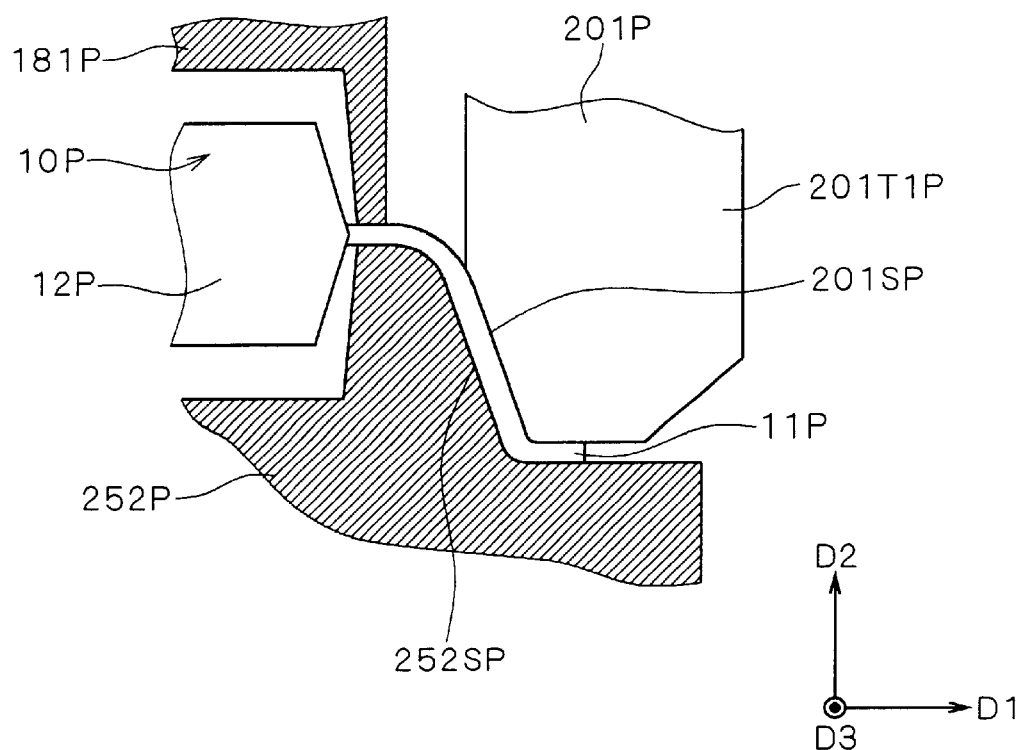
FIG. 16 is a schematic side view of principal parts of the second background art semiconductor manufacturing apparatus for illustrating the operation thereof.
Figure 17:
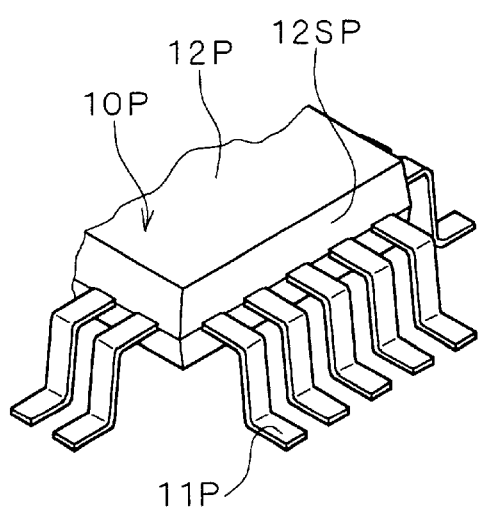
FIG. 17 is a schematic perspective view of a semiconductor device manufactured by the background art semiconductor manufacturing apparatus.

The semiconductor device 20 can suppress or prevents forming troubles such as a lead skew which is sidewise bending of the tip of a lead 11 (as viewed from above the semiconductor device 20) and a twist of a lead 11. Further, dividing the leads 11 into at least two blocks to couple the tips of the leads 11 is effective in that the leads 11 are more difficult to reflect the deformation of the package 12 than the leads 11 all of which are connected together in the lead group 11G. Therefore, the leads 11 having the predetermined configuration are formed reliably and accurately, as shown in FIG. 12. After the lead forming process, the connection 16 is cut and removed and the semiconductor device 10 shown in FIG. 9 is provided. Thus, the manufacture of the semiconductor device 10 by using the semiconductor device 20 provides the semiconductor device solderable with the above-mentioned sufficient bonding strength.

While the invention has been described in detail, the foregoing description is in all aspects illustrative and not restrictive. It is understood that numerous other modifications and variations can be devised without departing from the scope of the invention.

What is claimed is:

1. A semiconductor manufacturing apparatus comprising:
   a die including a die-side forming surface of a predetermined configuration and configured to receive a semiconductor device including a package and a lead projecting from said package, wherein said lead has a face-to-face relationship with said die-side forming surface;
   a punch including an end portion provided with a punch-side forming surface having a face-to-face relationship with said die-side forming surface, wherein said end portion is configured to perform a predetermined working operation upon said lead; and
   a driver configured to move said end portion of said punch substantially squarely toward said die-side forming surface with said punch-side forming surface and said die-side forming surface maintained in a parallel relationship,
   wherein said driver includes:
      a first driver configured to move said end portion of said punch in a first direction,
      a second driver configured to move said end portion of said punch in a second direction perpendicular to said first direction, and
      a third driver configured to move said end portion of said punch in a third direction making an angle with said first direction, and
      wherein said third direction and said lead of said semiconductor device are in a plane defined by said first and second to direction.

2. The semiconductor manufacturing apparatus according to claim 1, further comprising:
   a pressure detector configured to detect a load placed upon said end portion; and
   a controller configured to control said driver based on said load detected by said pressure detector.

3. The semiconductor manufacturing apparatus according to claim 1, further comprising
   a resilient element between said end portion and said driver.

4. The semiconductor manufacturing apparatus according to claim 1, further comprising:
   a rotative driver configured to rotate at least one of said punch, said die, and said semiconductor device about said package, with a positional relationship maintained between said punch, said die, and said semiconductor device relative to each other.

5. The semiconductor manufacturing apparatus according to claim 1, further comprising:
   a retainer including a mechanism configured to adhere to said package under suction, wherein said retainer contacts said package on an opposite side from said die to hold said semiconductor device.

6. The semiconductor manufacturing apparatus according to claim 1, further comprising:
   a contact detector configured to detect a contact between said end portion and said die-side forming surface with said lead therebetween.

7. The semiconductor manufacturing apparatus according to claim 1,
   wherein said lead of said semiconductor device includes a plurality of leads, and
   wherein said punch performs said predetermined working operation simultaneously upon a group of leads projecting substantially in a same direction among said plurality of leads.

8. The semiconductor manufacturing apparatus according to claim 7,
   wherein said group of leads are divided into at least two blocks, and
   wherein adjacent leads included in each of said blocks are connected to each other at tips of said adjacent leads.

9. The semiconductor manufacturing apparatus according to claim 1,
   wherein said punch includes a plurality of punches configured to move independently of each other.

10. The semiconductor manufacturing apparatus according to claim 9,
wherein said end portion of each punch is configured to independently place a predetermined forming load upon said lead.

11. A method of manufacturing a semiconductor device, comprising the steps of:
placing a semiconductor device including a package and a lead projecting from said package on a die having a die-side forming surface of a predetermined configuration, wherein said lead is in a face-to-face relationship with said die-side forming surface;
bringing an end portion of a punch, including a punch-side forming surface having a face-to-face relationship with said die-side forming surface, into contact with a side of said lead opposite said die-side forming surface; and
moving said end portion of said punch substantially squarely toward said die-side forming surface with said punch-side forming surface and said die-side forming surface maintained in a parallel relationship,
wherein said steps of bringing and moving are performed by using a driver for said punch,
wherein said driver includes:
a first driver configured to move said end portion of said punch in a first direction,
a second driver configured to move said end portion of said punch in a second direction perpendicular to said first direction, and
a third driver configured to move said end portion of said punch in a third direction making an angle with said first direction, and
wherein said third direction and said lead of said semiconductor device are in a plane defined by said first and second directions.

12. The method according to claim 11, wherein the step of moving comprises:
holding said lead between said punch-side forming surface and said die-side forming surface with a predetermined forming load placed on said lead.

* * * * *

UNITED STATES PATENT AND TRADEMARK OFFICE
CERTIFICATE OF CORRECTION

PATENT NO. : 6,363,976 B1
DATED : April 2, 2002
INVENTOR(S) : Aoki et al.

It is certified that error appears in the above-identified patent and that said Letters Patent is hereby corrected as shown below:

<u>Title page,</u>
Assignee information is listed incorrectly. It should read as follows:
-- [73] Assignee:   Mitsubishi Denki Kabushiki Kaisha,
   Mitsubishi Electric Engineering Co., Ltd.,
   both of Tokyo (JP) --

Signed and Sealed this

First Day of October, 2002

Attest:

Attesting Officer

JAMES E. ROGAN
*Director of the United States Patent and Trademark Office*